United States Patent [19]
Ohlbach

[11] Patent Number: 4,706,438
[45] Date of Patent: Nov. 17, 1987

[54] CONDUCTIVE CONTAINER

[75] Inventor: Ralph C. Ohlbach, Deerefield, Ill.

[73] Assignee: Conductive Containers, Inc., Northbrook, Ill.

[21] Appl. No.: 41,439

[22] Filed: Apr. 23, 1987

Related U.S. Application Data

[62] Division of Ser. No. 838,292, Mar. 10, 1986, Pat. No. 4,684,020.

[51] Int. Cl.⁴ .............................................. B65D 81/14
[52] U.S. Cl. ........................................ 53/410; 53/472
[58] Field of Search .............. 53/472, 411, 410, 456, 53/462; 206/328

[56] References Cited

U.S. PATENT DOCUMENTS

| | | | |
|---|---|---|---|
| 4,160,503 | 7/1979 | Ohlbach | 206/328 |
| 4,241,829 | 12/1980 | Hardy | 206/328 |
| 4,293,070 | 10/1981 | Ohlbach | 53/472 |
| 4,424,900 | 1/1984 | Petcavich | 206/328 |
| 4,557,379 | 12/1985 | Lanz et al. | 206/328 |
| 4,609,104 | 9/1986 | Kasper et al. | 206/328 |

*Primary Examiner*—Joseph Man-Fu Moy
*Attorney, Agent, or Firm*—Kinzer, Plyer, Dorn, McEachran & Jambor

[57] ABSTRACT

Conductive container for electronic devices, constructed of paperboard having a conductive coating or layer or impregnant extending from the inside to the outside of the container, with a sandwiched thin metal foil in effective contact with the conductive material.

6 Claims, 7 Drawing Figures

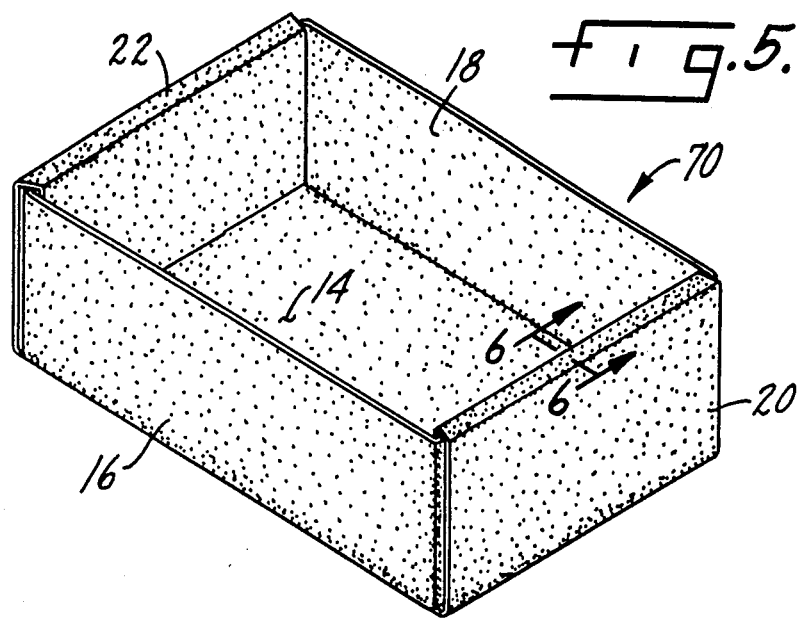
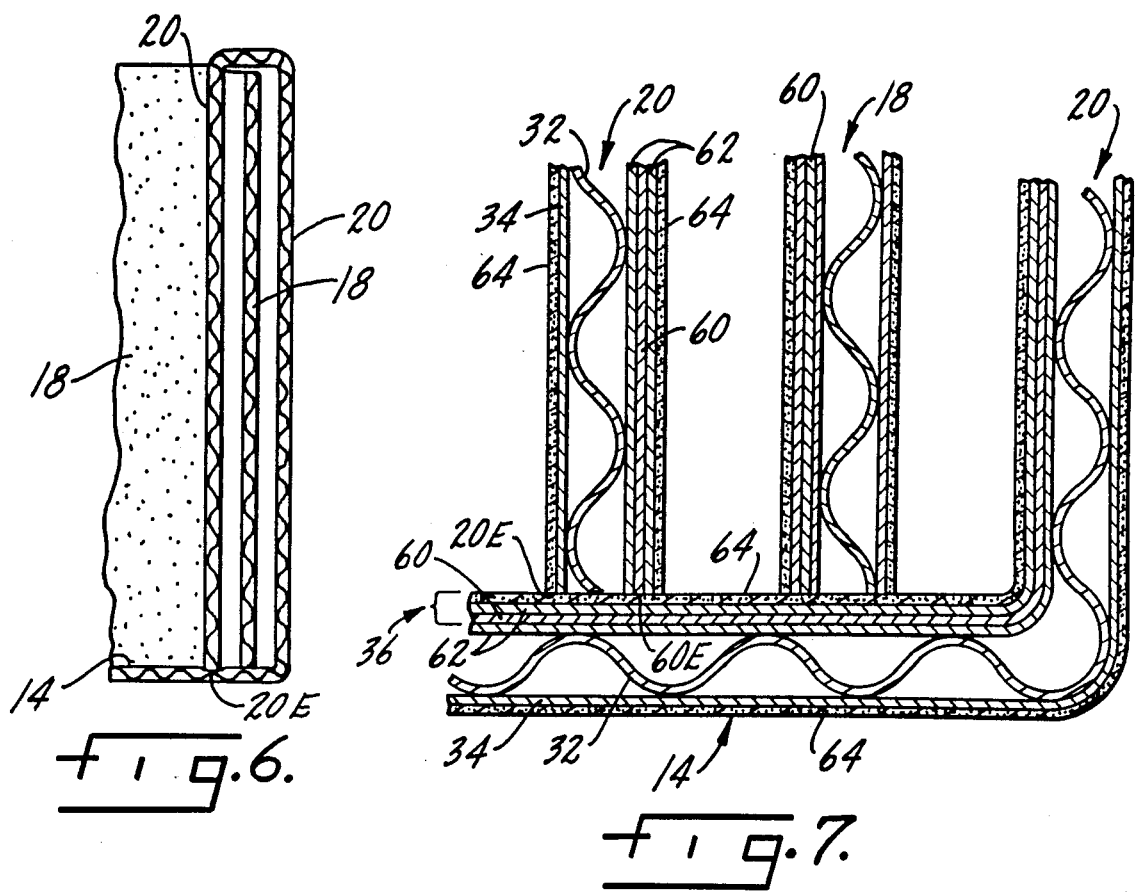

CONDUCTIVE CONTAINER

This is a division of application Ser. No. 838,292, filed Mar. 10, 1986 now U.S. Pat. No. 4,684,020.

This invention relates to the protection of goods which can be damaged by a discharge of static electricity and by other electrical phenomenon to be explained, particularly fields due to electromagnetic and radio frequencies.

With the advent of microcircuitry and the use of integrated circuits incorporating metal oxide semiconductors, complimentary metal oxide semiconductors, field effect transistor silicone chips, related microcircuitry and electronics where threshold voltages or potentials may be five or ten volts or even less, the devices are hypersensitive to electrical current or emf values which cannot be avoided in every day life. Examples of such unavoidable interferences are small charges built up on a person's body as the result of mere movement across an insulated surface, electromagnetic waves and radio frequencies.

I have effectively coped with the electrostatic phenomenon under the disclosures according to my U.S. Pat. Nos. 4,160,503, 4,211,324 and 4,293,070. Practice under these patents has amounted to considerable commercial success and it can be safely stated that in many instances the cartons of those patents have been adopted as standard practice by some of the largest companies in the world.

Briefly stated, the disclosure in the Ohlbach patents listed in the foregoing paragraph are concerned with creating a carbon black circumvalate trap by which any electrostatic charge is trapped in the carbon black coating or layer and is either bled off to ground or circulates harmlessly until the charge decays to a harmless or meaningless value. However, the conductive carbon black is not necessarily an effective shield against electromagnetic and radio frequencies. The electronic devices inside the container (chips or microcircuitry) can also be damaged or rendered useless by a field of radio frequency or electromagnetic waves. In the industry these phenomena are termed emi (electromagnetic interference) and rfi (radio frequency interference). The interferring field alone, without any current flow, whether emi or rfi, can itself be the source of damage, known as electrical overstress. On the other hand, if the device is moved within the field, then by Kirchoff's law, a current is induced in the device which itself may be strong enough to damage or ruin the chip or the circuitry. Shielding an electronic device or the associated circuitry (herein both are referred to as the "device") to prevent interference from an electromagnetic or radio source is known: U.S. Pat. Nos. 2,766,920 and 2,899,050; also the article in the publication ITEM, 1983 entitled "Shielding—Coating Options in the Eighties." In brief, the device is surrounded by a thin metal foil (e.g. aluminum foil) and the metal foil by absorption of the field (capture) or mere reflection of the field or internal re-reflection (resonance) greatly reduced the chances of damage of the device due to electrical overstress or due to the creation of an unwanted current under Kirchoff's law. However, since the metal foil is a conductor, it itself is subject to Kirchoff's law, namely, that a conductor moving within a field will create a current; and if the foil is sandwiched between insulators, the phenomenon of a capacitor is created. In any event, the hazard is present, namely, a charge on the metal foil itself and that charge can become the source of a spark or static discharge spike when the package is opened and the device is exposed.

It is an object of the present invention to effectively deal with the two interferences identified above (emi and rfi) in a container of the kind disclosed in my aforesaid patents; specifically it is an object of the present invention to assure that any induced current created on the shield may be drained or grounded.

IN THE DRAWING:

FIG. 5 is a perspective of another embodiment;

FIG. 6 is a sectional view, enlarged, on the line 6—6 of FIG. 5; and

FIG. 7 is an enlarged portion of FIG. 6.

Figure 1:
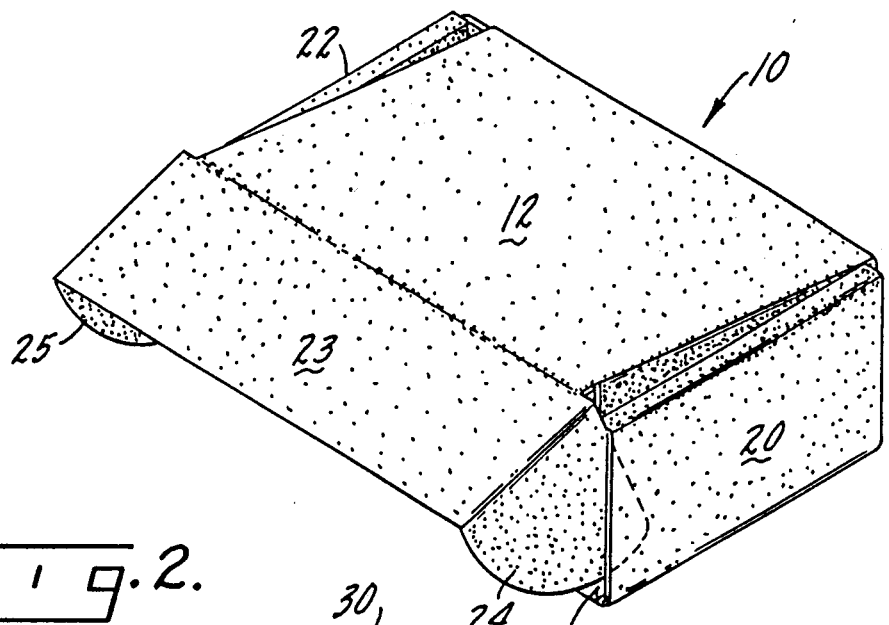
FIG. 1 is a perspective view of a typical container constructed under the present invention and representing one embodiment.
Figure 2:
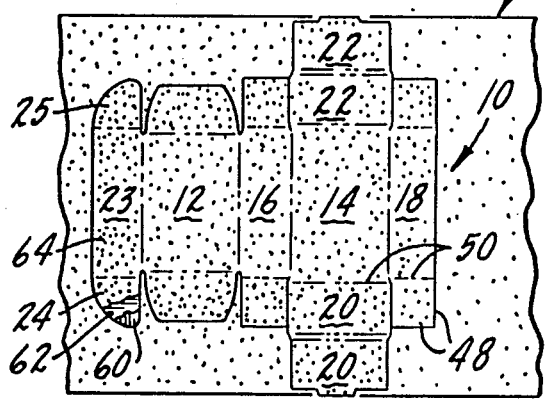
FIG. 2 is a plan view of the development of a carton blank to construct the container shown in FIG. 1.

A typical container contemplated under the present invention is illustrated in FIGS. 1 and 2, identified by reference character 10. The container 10 is a six-sided carton having a top wall 12, a bottom wall 14, end walls 16 and 18, side walls 20 and 22 (double thickness, folded) and a closure flap 23 with tuck-in ears 24 and 25.

The carton or box 10 is for illustrative purposes only. The container in actual practice will vary considerably in dimensions, depending upon the electronic device to be encapsulated and protected by the carbon black circumvalate to be described hereinafter. I preferably rely on a corrugated construction of E-flute or equivalent strength because this form is easy to manufacture and has excellent physical strength. For a stronger box, B-flute, C-flute and double-wall thicknesses may be used. However, the carton could as well be constructed from so-called chip-board of suitable strength, or it could be built up from an appropriate number of thicknesses of paper laminae such as double wall, as long as there is a metal shield for protecting the device from electromagnetic interference or radio frequency interference and as long as there is a layer of conductive carbon black (or equivalent particulate conductor) safeguarding the devices against discharge of static electricity and affording effective contact with the metal liner as will be explained.

Figure 3:
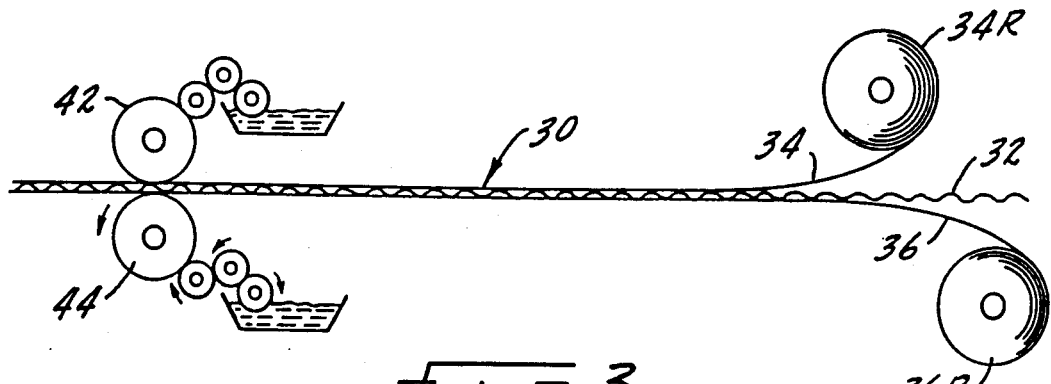
FIG. 3 is a schematic view of the formation of a web of paperboard for constructing the container.

Referring to FIG. 3, a paperboard web 30 is formed in the usual fashion from an intermediate corrugated paperboard flute 32 sandwiched between a pair of opposed paperboard liners 34 and 36, adhesively joined in the usual manner constituting no part of the present invention. The liners are supplied from large rolls 34R and 36R.

The opposed planar surfaces of the two liners 34 and 36 are coated with conductive carbon black dispersed in a suitable varnish, such as employed in a printer's ink. The carbon black dispersion may be applied by being roller-coated by opposed rollers 42 and 44. The coating, an emulsion composed of carbon black and the suitable vehicle, such as the printer's ink varnish, may also, alternatively, be applied to the liners 34 and 36 before the liners are shipped as rolls. Thus the liner material may be coated with carbon black before being joined to the corrugated filler 32, rather than afterwards as shown in FIG. 3. This is a matter of economics and manufacturing capability.

The preferred conductive particles are VULCAN XC-72LR conductive carbon black supplied by Cabot Corporation: 98.5% by weight fixed carbon (1.5% volatiles), 19 millimicrons mean diameter, log volume resistivity (Ohms-cm) in the range of about 2.3–6. This feature of the present invention, in practice, is the same as disclosed in my aforesaid patents.

Figure 4:
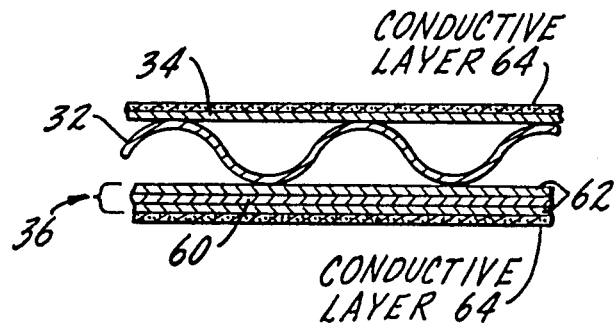
FIG. 4 is a sectional view on a greatly enlarged scale of one of the liners used to construct the container.

After the paperboard web has been constructed, in whatever form, whether corrugated, chip board, paper lamination or otherwise, of the preferred strength for physical protection of the devices contained therein, the web is then employed as a source of the carton blank, FIG. 2. The blank is then die-cut along a continuous perimeter edge as 48 and is scored along the fold lines as 50. When separated from the web, the carton blank may be shipped to the user in the flat state or it may be erected, depending upon different modes of production, shipment and use. In accordance with the present invention, and again in the instance of a corrugated box, one of the liners 34 and 36 (or both of them, if one wants to go that far) is employed as a support for the metal foil shield. This is shown on a greatly enlarged scale in FIG. 4 without attempt to show relative dimensions. In FIG. 4 it is assumed the liner 36 is to be employed as the foil support. Thus, as part of the manufacture of the liner 36, a thin metal foil 60 is cemented or otherwise bonded between thin sheets of paper 62. The exposed sheet of paper 62 is the surface that will be coated with a carbon black layer 64 by roller 44, but again the liner 36 with carbon black layer 64 may be manufactured beforehand, rolled and shipped to take the place of the roll 36R, FIG. 3. Therefore, FIG. 4 may be considered a fragment of a longitudinal section of web 30. In any event, when the blank, FIG. 2, is die-cut and scored, the carton blank to be separated will be characterized by continuous areas of conductive carbon black with a metal foil of continuous area sandwiched there-between.

The foil has a thickness of the order of 0.0001 of an inch, and may be more or less. Aluminum is preferred but foils of iron and other metals are also available as a substitute. The paper support 62 is also thin, and in fact is sufficiently thin that when humidity is high there is effective conductivity contact between the metal foil 60 and the carbon black coating 64 which necessarily impregnates and penetrates to some extent at least a portion of the liner sheet to which it is applied. However, as will be explained below, there is even more assurance the foil will be in effective contact with the carbon black.

As noted above, the erected and folded carton may be of almost any geometry. It may be of one panel thickness such as shown in my aforesaid patents, or it may be of double-wall thickness, especially at the sides, which is the form of construction here illustrated.

Stippling in FIGS. 1 and 2 indicates the carbon black continuum surfaces.

There is to be electrically conductive contact between the carbon black on the inside and the carbon black on the outside of the carton, and this may be readily achieved by virtue of either double-wall folds or ears on the closure flap, with carbon black on an inside surface in contact with the carbon black extending to an outside surface of the folded container. Indeed, when the ears 24 and 25 are tucked into the sidewall fold slots as 20S, FIG. 1, there are four conductive carbon surfaces in contact, whereby the circumvalate trap for static electricity is in reality a continuum from the inside to the outside container so that any static discharge may be conducted to ground from either the inside or the outside of the container.

The metal foil shield safeguards the contained device against electromagnetic interference and radio frequency interferences. These interferences in reality are, of course, fields capable of inducing a current should the device within the container be moved within the field. The shield also safeguards the device against electrical overstress by the very presence of the field itself in a static state, regardless of any current induced. However, the shield itself is a conductor capable of supporting an induced current but this current, if created, will be drained to the conductive carbon black layer on the outside due to its being in effective contact with the carbon black layer supported on the inner liner of the corrugated blank from which the container is erected. Also, and again because the carbon black layers are in contact with one another, there is no chance of an electrostatic discharge, from whatever source, reaching the contained device which, as noted above, can be overstressed and damaged by voltages as low as five to ten volts, if not lower.

There are two ways such draining of the current or charge can take place. First, because the paper layers 62 are quite thin there will invariably be some spot, a spot at least, where the carbon black is in effective contact with the foil, especially when humidity is high because the paper itself then becomes a conductor. But more importantly, when the carton is constructed there will be one or more folds presenting a bare edge of the foil in direct contact with a carbon black surface as will now be explained in connection with FIGS. 4–6.

The container 70 shown in FIG. 4 is intended to illustrate that the invention may be applied to a five-walled container constituting an assembly tray or storage bin for electronic parts subject to damage by the same phenomena discussed above.

The container 70 will be obtained in the same manner as explained in connection with FIGS. 2 and 3 except when the carton blank is scored and die-cut there will be no provision for a top or lid 12, front closure flap 23, nor tuck-in ears 24 and 25. The parts deemed the same are denoted by the same reference characters employed in FIGS. 1 and 2.

FIG. 5 is an enlarged section taken on the line 5—5 at one side of the container 70, FIG. 4, and FIG. 6 is an enlargement of a portion of FIG. 5.

Referring now to FIG. 6, the bottom wall 14 is shown on an enlarged scale compared to FIG. 5 and so is the fold-over end wall 20. This fold-over, as will be evident in FIG. 5, constitutes a strengthening flap at the end, and the free die-cut edge 20E is in contact with the inside surface of the bottom wall. This means the die-cut edge 60E of the metal foil 60 will be in effective electrical contact with the carbon black layer 64 at the inside of the container, such contact assuring that any charge or current induced on or in the foil will be drained to the carbon black surface 64 and from thence to the carbon black layer 34 on the outside surface of the container, where it may be drained to ground. The end wall 18, FIG. 7, will also present a die-cut edge of the contained foil to carbon black surface 64.

Because the carton blank is die-cut and because the carbon black surfaces are continuous, and because the interposed metal foil is continuous, the die-cut edges inherently expose an edge of the metal foil. Therefore what has been been explained in connection with the tray form of the invention, FIG. 4, where the die-cut edge of the metal foil 60 effectively accounts for draining any induced charge on the foil applies equally well to the form of the container as shown in FIG. 1. Thus it can be readily imagined, FIG. 1, that when the end flaps or ears 24 and 25 are tucked into their respective slots as 20S the die-cut edges of the metal foil, at the exposed edges of the ears 24 and 25, will be in effective contact with the conductive carbon black layer at the inside surface of the carton; this applies equally well to the end wall 18 and fold-over flaps 20 and 22 of FIG. 1.

Hence while I have illustrated and described preferred embodiments of my invention, it is to be understood that these are capable of variation, modification and other equivalent practice.

I claim:

1. A method of constructing an inexpensive but effective carbon black circumvalate as a trap for static electricity originating outside or inside the trap and for dissipating induced currents so that goods inside the trap, which may be damaged by a discharge of static electricity or an induced charge, are protected, said method comprising:
   (a) continuously surfacing a web of paperboard on opposed planar surfaces with a conductive carbon black dispersion, thereby to provide a web comprising opposed surfaces of conductive carbon black and uniting to said web a metal foil to lie adjacent a carbon black surface eventually to serve as a shield against an electromagnetic field and a radio frequency field;
   (b) scoring the web and separating therefrom a carton blank including at least one flap, the separated edges of said carton blank bounding the metal foil and also bounding continuous carbon black surfaces;
   (c) folding and erecting a carton from said separated blank so that said carbon black is present on outside and on inside surfaces of the carton, and to present said flap having carbon black on one side thereof in contact with carbon black on the inside of the carton when the flap is closed, thereby forming a carbon black circumvalate trap; and
   (d) inserting into such carton cavity electronic goods to be protected against the ravages of a discharge of static electricity or charges from a current induced on the shield in the presence of such a field.

2. A method according to claim 1 in which the flap is so folded and dimensioned as to present an edge thereof in contact with the inside of the carton, which edge presents an edge of metal foil in contact with carbon black at the inside of the carton.

3. A method according to claim 2 in which the carton blank separated from the web includes a top closure wall and flap to afford a closed six-walled carton.

4. A method according to claim 1 in which the metal foil lying adjacent one of the carbon black surfaces is in effective electrical contact therewith directly to drain thereto any electrical charge or current induced on or in the foil.

5. A method of constructing an inexpensive but effective carbon balck circumvalate as a trap for static electricity originating outside or inside the trap and for dissipating induced currents so that goods inside the trap, which may be damaged by a discharge of static electricity or an induced charge, are protected by the carbon black circumvalate, said method comprising:
   (a) providing a web of paperboard with a continuous area of conductive carbon black derived from a dispersion of carbon black dispersed in a liquid carrier, thereby to provide a paperboard web supporting a continuum of conductive carbon black;
   (b) providing said web with a conductive metal foil as a continuum in juxtaposition with the carbon black continuum eventually to serve as a shield against electromagnetic and radio frequency fields;
   (c) scoring the web and separating therefrom a carton blank lying within said area, the separated edges of said carton blank bounding the metal foil and also bounding the carbon black continuum;
   (d) folding and erecting a carton from said separated blank so that said carbon black continuum extends from the inside to the outside of the carton and by which the carton may be connected to ground from either the inside or outside and by which an induced current on the foil may be drained to the carbon black continuum; and
   (e) inserting into the cavity presented by the carton electronic goods to be protected against the ravages of a discharge of static electricity or charges from a current induced on the shield in the presence of electromagnetic or radio frequency fields.

6. Method according to claim 5 in which at least one of the separated edges presents an edge of metal foil in contact with a carbon black surface on the inside of the carton when erected.

* * * * *